United States Patent [19]

Seki et al.

[11] Patent Number: 5,491,106
[45] Date of Patent: Feb. 13, 1996

[54] METHOD FOR GROWING A COMPOUND SEMICONDUCTOR AND A METHOD FOR PRODUCING A SEMICONDUCTOR LASER

[75] Inventors: Akinori Seki, Toyota; Hiroyuki Hosoba, Nara; Toshio Hata, Nara; Masafumi Kondo, Nara; Takahiro Suyama, Yamatokoriyama; Sadayoshi Matsui, Tenri, all of Japan

[73] Assignee: Sharp Kabushiki Kaisha, Osaka, Japan

[21] Appl. No.: 97,316

[22] Filed: Jul. 23, 1993

Related U.S. Application Data

[63] Continuation of Ser. No. 798,669, Nov. 26, 1991, abandoned.

[30] Foreign Application Priority Data

Nov. 26, 1990 [JP] Japan ............................ 2-324347

[51] Int. Cl.$^6$ .......................... H01L 21/20; H01L 21/302
[52] U.S. Cl. .......................... 437/107; 437/129; 437/133; 437/946; 117/106
[58] Field of Search .......................... 437/105, 107, 437/126, 129, 133, 946; 148/DIG. 96, DIG. 65; 156/643, 662; 204/298.36

[56] References Cited

U.S. PATENT DOCUMENTS 3,915,765  10/1975  Cho et al. .............................. 437/946

(List continued on next page.)

FOREIGN PATENT DOCUMENTS

| 0196897 | 10/1986 | European Pat. Off. . | |
|---|---|---|---|
| 0435639 | 7/1991 | European Pat. Off. | 117/106 |
| 0456485 | 11/1991 | European Pat. Off. . | |
| 0066810 | 4/1985 | Japan | 437/946 |
| 0141724 | 6/1987 | Japan | 437/946 |
| 62-207796 | 9/1987 | Japan | 117/106 |
| 62-212293 | 9/1987 | Japan | 117/106 |
| 62-269310 | 11/1987 | Japan | 117/106 |
| 4-312915 | 11/1992 | Japan | 437/107 |
| 5-136056 | 6/1993 | Japan | 437/107 |
| 5-182910 | 7/1993 | Japan | 117/106 |

OTHER PUBLICATIONS

Kean et al., "Gallium desorption from (Al,Ga)As grown by molecular beam epitaxy at high temperatures", Journal of Crystal Growth, vol. III, 1991, pp. 189–191.

Saito et al., "High–temperature growth of Si–doped AlGaAs by molecular–beam epitaxy", J. Vac. Sci Technol. B, vol. 8, No. 6, Nov./Dec. 1990, pp. 1264–1269.

Okamoto et al., "Selective epitaxial growth of gallium arsenide by molecular beam epitaxy", Appl. Phys. Lett., vol. 51, No. 19, 9 Nov. 1987, pp. 1512–1514.

Kawabe et al., "A New Composition Control Method of $Al_xGa_{1-x}As$ by Molecular Beam Epitaxy", Proc. 13th Conference on Solid State Devices, Jap. J. Appl. Phys., vol. 21, Supplement 21–1, 1982, pp. 439–440.

Hiyamizu et al., "MBE–Grown Selectively Doped GaAs/N–AlGaAs Heterostructures and their Application To High Electron Mobility Transistors", Semiconductor Technologies, 1982, pp. 258–271.

Fischer, R., et al., "Incorporation rates of gallium and aluminum on GaAs during molecular beam epitaxy at high substrate temperatures" J. Appl. Phys. (1983) 54(5):2508–2510.

Patent Abstracts of Japan, vol. 10, No. 306, (E–446) (17 Oct. 1986).

Patent Abstracts of Japan, vol. 14, No. 89, (E–891) (19 Feb. 1990).

Primary Examiner—Mary Wilczewski
Attorney, Agent, or Firm—Morrison & Foerster

[57] ABSTRACT

A method for growing a compound semiconductor layer of $Al_xGa_{1-x}As$ ($0 \leq x \leq 1$) on a compound semiconductor substrate uses a molecular beam epitaxial apparatus, the method including the steps of providing the substrate having a GaAs layer on an upper surface thereof, thermally etching the GaAs layer by heating the substrate at a temperature and irradiating the GaAs layer with a gallium molecular beam and an arsenic molecular beam to expose the upper surface of the substrate, and growing the $Al_xGa_{1-x}As$ ($0 \leq x \leq 1$) layer on the upper surface of the substrate.

7 Claims, 4 Drawing Sheets

U.S. PATENT DOCUMENTS

| | | | |
|---|---|---|---|
| 4,421,576 | 12/1983 | Jolly | 437/946 |
| 4,421,577 | 12/1983 | Spicer | 437/107 |
| 4,622,083 | 11/1986 | Shih | 437/946 |
| 4,734,158 | 3/1988 | Gillis | 204/298.36 |
| 4,783,425 | 11/1988 | Fukuzawa et al. | 437/129 |
| 4,824,518 | 4/1989 | Hayakowa et al. | 437/225 |
| 4,829,022 | 5/1989 | Kobayashi et al. | 437/107 |
| 4,876,218 | 10/1989 | Pessa et al. | 437/107 |
| 4,920,069 | 4/1990 | Fossum et al. | 437/107 |
| 4,960,720 | 10/1990 | Shimbo | 437/107 |
| 5,026,655 | 6/1991 | Ohata | 437/107 |
| 5,079,185 | 1/1992 | Kagawa et al. | 437/129 |
| 5,153,148 | 10/1992 | Sakiyama et al. | 437/129 |
| 5,194,400 | 3/1993 | Takamori et al. | 437/129 |
| 5,248,376 | 9/1993 | Saito | 117/106 |
| 5,360,762 | 11/1994 | Takahashi et al. | 437/129 |

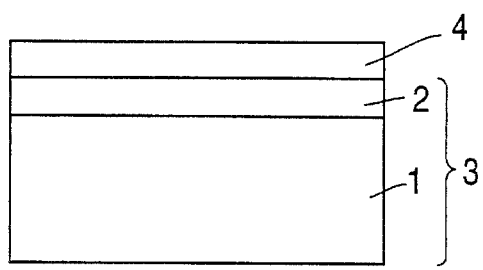
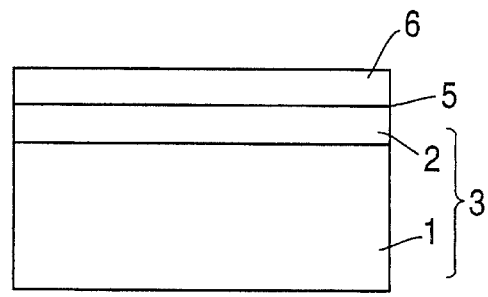
FIG. 1A  FIG. 1B
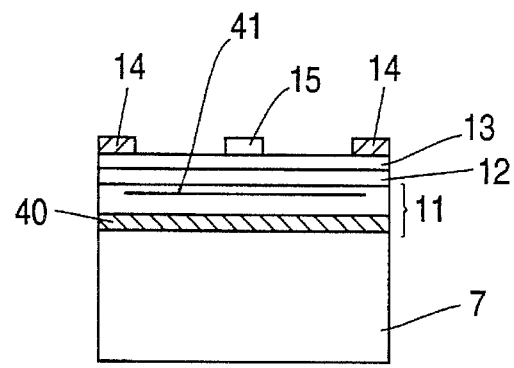
FIG. 4 (Prior Art)

METHOD FOR GROWING A COMPOUND SEMICONDUCTOR AND A METHOD FOR PRODUCING A SEMICONDUCTOR LASER

This application is a continuation of application Ser. No. 07/798,669, filed Nov. 26, 1991, abandoned.

BACKGROUND OF THE INVENTION

1. Field of the Invention

The present invention relates to a method for growing GaAs and AlGaAs layers by the use of a molecular beam epitaxial (MBE) apparatus, and more particularly to a method for producing an AlGaAs type semiconductor laser by the use of the MBE apparatus.

2. Description of the Prior Art

In recent years, a method for producing high electron mobility transistors (HEMTs) or semiconductor lasers as an AlGaAs type semiconductor device by the use of an MBE apparatus has been proposed. These devices are produced by epitaxially growing an AlGaAs layer and a GaAs layer on a GaAs substrate.

In the epitaxial growth used for producing an AlGaAs type semiconductor device, the substrate surface is required to be clean and flat in order to grow an epitaxial layer of good quality thereon. The surface of a GaAs substrate may be cleaned, for example, by etching the surface with $H_xSO_4$ and then evaporating the oxide layer formed on the surface. This evaporating process is performed in the MBE apparatus using an arsenic (As) molecular beam at a high temperature under ultra-high vacuum. An epitaxial layer having a flat surface may be obtained then, for example, by growing a GaAs buffer layer with a thickness of several μm on the substrate surface cleaned as above at a relatively low temperature of 500° to 550° C.

However, the above processes are not applicable to a semiconductor device in which an $Al_xGa_{1-x}As$ ($0 \leq x \leq 1$) layer is required to be grown directly on an AlGaAs substrate without a GaAs buffer layer interposed therebetween.

Moreover, a GaAs buffer layer obtained by the above processes may have poor crystallinity because of defects or impurities along the interface between the substrate and the buffer layer, resulting in unsatisfactory characteristics of the semiconductor device. For example, in the HEMT shown in FIG. 4, poor crystallinity of a GaAs buffer layer 40 reduces the mobility of channel electrons in the active region (a channel region) 41 disposed close to the buffer layer 40.

FIGS. 5(a) to 5(d) illustrate a typical method for producing a semiconductor laser by the use of an MBE apparatus, which is disclosed in Japanese Patent Publication No. 1-37873. In this method, a first growth layer is formed on a semiconductor substrate by the use of an MBE apparatus. The first growth layer includes a first upper cladding layer 123 and a light absorption layer 124. Then, the semiconductor substrate is taken out of the MBE apparatus and a striped groove is formed in a region 128 by photolithography and etching so as to expose the light absorption layer 124. This etching step leaves impurities such as oxides on the exposed surface of the light absorption layer 124. These impurities are then evaporated by irradiation with an As molecular beam at a high temperature in the MBE apparatus. In this evaporating step, the light absorption layer 124 remaining in the region 128 is also evaporated, thereby exposing a very clean surface of the first upper cladding layer 123. Then, a second growth layer including the second upper cladding layer 129 is grown on the first growth layer in the MBE apparatus, resulting in high quality of the second growth layer containing no undesirable impurities.

However, in the above evaporating step using only As as a molecular beam, the surface condition of the exposed light absorption layer 124 greatly affects the surface condition of the resulting first upper cladding layer 123. In addition, the intensity of the As molecular beam, the temperature of the substrate and the shape of the striped groove also affect the evaporating step. Therefore, very limiting conditions are required in order to attain the evaporation satisfactorily. Particularly, when the light absorption layer 124 in the region 128 has unevenly distributed impurities on the exposed surface thereof, the light absorption layer 124 in the region 128 is not evaporated evenly. In other words, the microscopic unevenness generated on the exposed surface of the light absorption layer 124 by the etching step is enlarged by the subsequent evaporating step. In addition, unevenness in the temperature of the substrate or in the intensity of the As molecular beam also results in incomplete evaporation.

Because of these phenomena, the light absorption layer 124 may partially remain along the interface between the first upper cladding layer 123 and the second upper cladding layer 129 in the above-mentioned semiconductor laser structure, thereby adversely affecting the laser oscillation characteristics (i.e., decreasing luminous efficiency) and thus damaging the production yield and/or the uniformity of the semiconductor laser.

SUMMARY OF THE INVENTION

In accordance with one aspect of this invention, a method is provided for growing a compound semiconductor layer of $Al_xGa_{1-x}As$ ($0 \leq x \leq 1$) on a compound semiconductor substrate by the use of a molecular beam epitaxial apparatus, the method including the steps of: providing the substrate having a GaAs layer on an upper surface thereof; thermally etching the GaAs layer by heating the substrate at a temperature and by irradiating the GaAs layer with a gallium molecular beam and an arsenic molecular beam so as to expose the upper surface of the substrate; and growing the $Al_xGa_{1-x}As$ ($0 \leq x \leq 1$) layer on the upper surface of the substrate.

In accordance with another aspect of the invention, a method is provided for growing a compound semiconductor layer of $Al_xGa_{1-x}As$ ($0 \leq x \leq 1$) on a compound semiconductor substrate by the use of a molecular beam epitaxial apparatus, the method including the steps of: providing the substrate having a GaAs layer on an upper surface thereof; thermally cleaning an upper surface of the GaAs layer by heating the substrate at a first temperature and by irradiating the GaAs layer with an arsenic molecular beam; thermally etching the GaAs layer by heating the substrate at a second temperature which is higher than the first temperature and by irradiating the GaAs layer with a gallium molecular beam and an arsenic molecular beam so as to expose the upper surface of the substrate; and growing the $Al_xGa_{1-x}As$ ($0 \leq x \leq 1$) layer on the upper surface of the substrate.

In accordance with still another aspect of the invention, a method is provided for producing by the use of a molecular beam epitaxial apparatus a semiconductor laser comprising a substrate, a first layered structure including a double-hetero structure and a GaAs layer, and a second layered structure, the method including the steps of: growing the first layered structure on the substrate so as to deposit the GaAs layer directly on the double-hetero structure; etching the first layered structure into a striped shape so as to expose a surface of the GaAs layer; thermally cleaning the exposed surface of the GaAs layer by heating the substrate at a first temperature and by irradiating the GaAs layer with an arsenic molecular beam; thermally etching the exposed surface of the GaAs layer by heating the substrate at a second temperature which is higher than the first temperature and by irradiating the GaAs layer with a gallium molecular beam and an arsenic molecular beam so as to expose a surface of the double-hetero structure; and growing the second layered structure on the upper surface of the first layered structure including the exposed surface of the double-hetero structure.

According to the present invention, in the method for growing a compound semiconductor layer and the method for producing a semiconductor laser, the compound semiconductor substrate having a thermally cleaned GaAs layer on an upper surface thereof is irradiated with a Ga molecular beam and an As molecular beam at a high temperature in the range of 600° to 800° C. In this way, the GaAs layer is thermally etched and thus a flat and clean surface is obtained on the compound semiconductor substrate. Accordingly, a compound semiconductor layer of good quality can be subsequently formed on the substrate.

Thus, the invention described herein makes possible the advantages of (1) providing a method for producing a semiconductor structure in which an $Al_xGa_{1-x}As$ ($1 \leq x \leq 1$) layer is directly deposited on a substrate of an AlGaAs type semiconductor; (2) providing a method for producing a semiconductor structure in which a GaAs buffer layer having poor crystalline characteristics is not included between an $Al_xGa_{1-x}As$ ($0 \leq x \leq 1$) layer and a substrate; and (3) providing a method for producing a semiconductor laser in which a compound semiconductor layer is formed on a flat and clean thermally etched surface, thereby realizing satisfactory characteristics of the semiconductor laser.

These and other advantages of the present invention will become apparent to those skilled in the art upon reading and understanding the following detailed description with reference to the accompanying figures.

BRIEF DESCRIPTION OF THE DRAWINGS

FIGS. 1(a) and 1(b) are schematic sectional views illustrating production stages of a semiconductor layer produced by an epitaxial growth method according to the present invention.

FIG. 4 is a schematic sectional view illustrating a conventional electron device (HEMT).

DESCRIPTION OF THE PREFERRED EMBODIMENTS

Figure 2A:
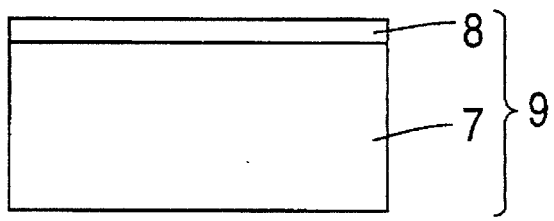
FIGS. 2(a), 2(b), and 2(c) are schematic sectional views illustrating production stages of a semiconductor layer produced by an epitaxial growth method according to the present invention.

The present invention will be described by way of illustrating stages of the methods of the invention with reference to the figures.

(Epitaxial growth method)

FIGS. 1(a) and 1(b) are sectional views illustrating production stages of a semiconductor layer produced by an epitaxial growth method according to the present invention.

A compound semiconductor substrate 3, consisting of an $Al_xGa_{1-x}As$ layer 2 and a GaAs substrate 1, is placed in an MBE apparatus. On this substrate 3, a GaAs layer 4 with a thickness of several thousands Å has been previously deposited by an epitaxial growth method such as the MBE method or the MOCVD method. The compound semiconductor substrate 3 is heated at a temperature of about 630° C., and the GaAs layer 4 is irradiated with an As (arsenic) molecular beam, thereby thermally cleaning the surface of the GaAs layer 4. This cleaning step may include the removal by evaporation of an oxide layer which has been formed on the surface of the GaAs layer 4 by, for example, etching with $H_2SO_4$. Then, the compound semiconductor substrate 3 is heated at a temperature in the range of 720° to 760° C., and a GaAs layer 4 is irradiated with a Ga (gallium) molecular beam and an As molecular beam for about thirty minutes. In this step, the amount of the incident molecular beams of Ga is set so as to make the growth rate of the GaAs layer 4 lower than the evaporation rate thereof. In this way, the GaAs layer 4 is evaporated (i.e., thermally etched), and a flat and clean surface 5 is obtained on the compound semiconductor substrate 3.

Moreover, an AlGaAs layer 6 is deposited on the surface 5 by irradiation with an Al (aluminum) molecular beam in addition to the Ga and As molecular beams. An AlGaAs layer 6 thus obtained is substantially flat and is directly deposited on the compound semiconductor substrate 3 with no buffer layer formed therebetween.

(Electron device)

Figure 2B:
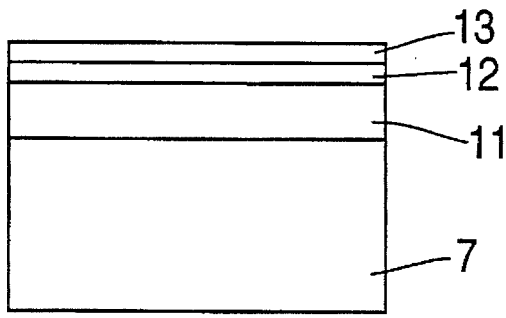
Figure 2C:
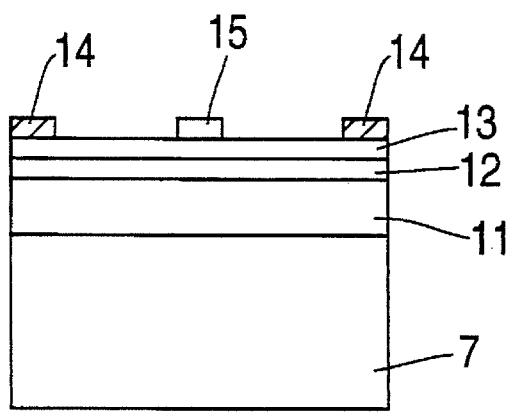

FIGS. 2(a), 2(b), and 2(c) are sectional views illustrating production stages of a semiconductor layer as a part of an electron device (HEMT), produced by an epitaxial growth method according to the present invention.

FIG. 2(a) shows a semi-insulated GaAs substrate 9, consisting of a GaAs layer 8, and a substrate which is not evaporated 7, used for the MBE growth. The surface of the substrate 9 has been cleaned by an etching treatment. After being placed in the MBE device, the GaAs substrate 9 is heated at a temperature in the range of 620° to 650° C. and is irradiated with an As molecular beam. In this way, an oxide film formed by the etching treatment on the surface of the GaAs substrate 9 is evaporated.

Next, the GaAs substrate 9 is heated at a temperature in the range of 720° to 750° C. and is irradiated with a Ga molecular beam and an As molecular beam so as to evaporate the GaAs layer 8, resulting in a flat and clean surface on the substrate 7.

As illustrated in FIG. 2(b), an undoped GaAs layer 11, an N-type $Al_{0.3}Ga_{0.7}As$ layer 12 and an N-type GaAs layer 13 are successively formed on the substrate 7 at a temperature of about 500° C. The HEMT structure obtained in this manner is taken out of the MBE device, and is provided with AuGe/Ni/Au N-type Ohmic electrodes 14 and a Ti/Pt/Au P-type Schottky electrode 15 by vacuum evaporation as shown in FIG. 2(c). In this way, an HEMT structure including a clear and flat interface between the substrate 7 and the undoped GaAs layer 11 can be produced.

(Method for producing a semiconductor laser)

FIGS. 3(a), 3(b), 3(c) and 3(d) are sectional views illustrating production stages of a semiconductor laser produced by an epitaxial growth method according to the present invention.

Figure 3A:
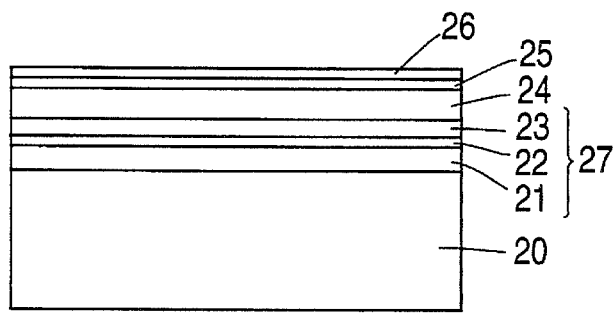
FIGS. 3(a), 3(b), 3(c) and 3(d) are schematic sectional views illustrating production stages of a semiconductor laser produced by an epitaxial growth method according to the present invention.
Figure 3B:
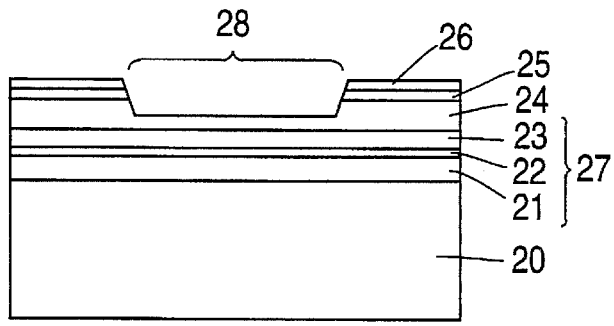

On an N-type (100) GaAs substrate 20, a Double Hetero (DH) structure 27 made of AlGaAs layers 21, 22 and 23, a light absorption layer 24 made of GaAs, an evaporation-preventing layer 25 made of an AlGaAs layer, and a regrowth protection layer 26 made of GaAs are grown by an epitaxial growth method such as MBE and MOCVD as shown in FIG. 3(a). The compound semiconductor structure obtained in this manner, including the DH structure 27, is then taken out of the growth apparatus. A stripe-shaped groove having a width of 3 to 5 μm is formed in a current passage region 28 of the compound semiconductor structure by photolithography and etching, so as to leave the light absorption layer 24 having a thickness of 1000 Å in the current passage region 28 as shown in FIG. 3(b).

Figure 3C:
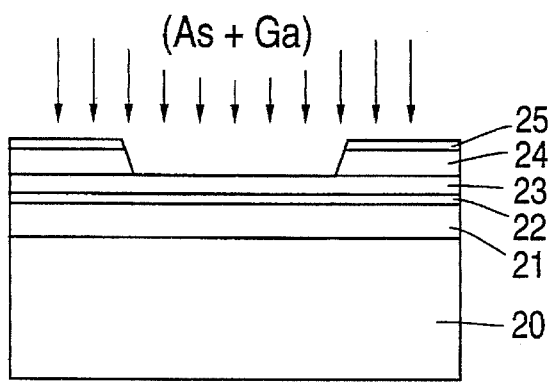

Then, after being placed in the MBE apparatus, the compound semiconductor structure having the stripe-shaped groove is irradiated with an As molecular beam and is heated at a temperature in the range of 620° to 650° C. Afterwards, a Ga molecular beam is used together with the As molecular beam for irradiation, and the temperature is kept in the range of 720° to 760° C. for several tens of minutes. The amount of the Ga molecular beam at this time is set so that the evaporation rate is higher than the growth rate of the GaAs layers. As a result, the light absorption layer 24 in the current passage region 28 and the regrowth protection layer 26 are evaporated, resulting in exposure of AlGaAs layers having clean surfaces as shown in FIG. 3(c). The exposed AlGaAs layers include a first upper cladding layer 23 in the current passage region 28 and the evaporation-preventing layer 25 in the other region.

Figure 3D:
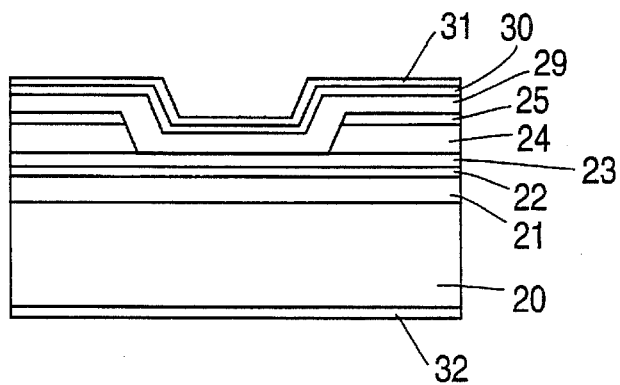
Figure 5A:
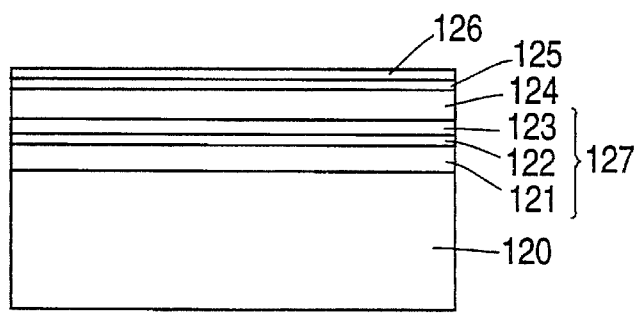
FIGS. 5(a), 5(b), 5(c) and 5(d) are schematic sectional views illustrating production stages of a semiconductor laser produced by a conventional method.
Figure 5B:
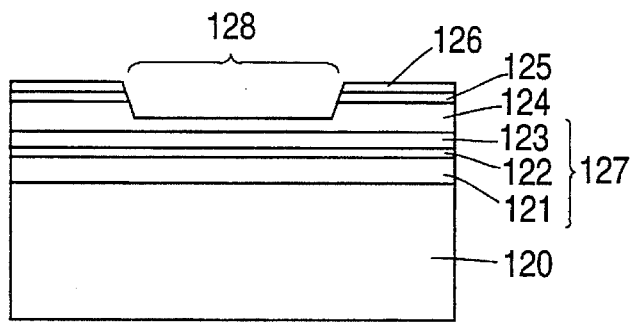
Figure 5C:
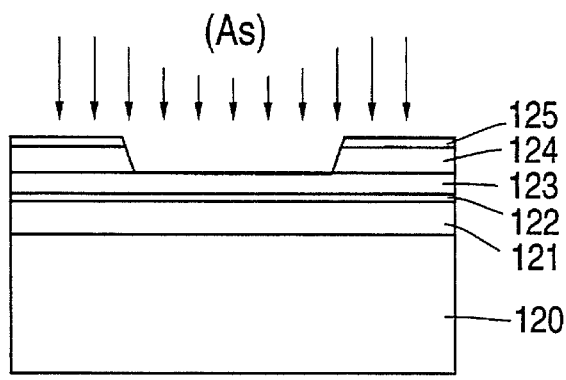
Figure 5D:
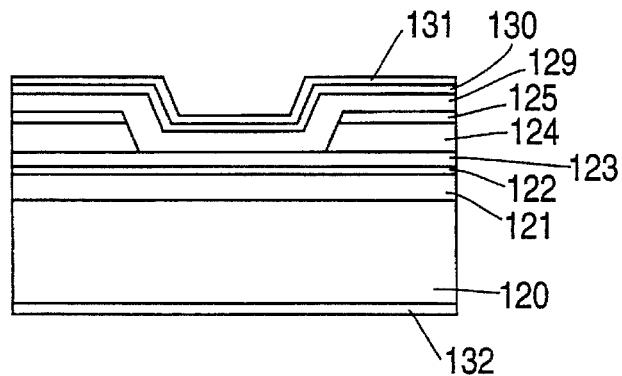

On the compound semiconductor structure having the exposed AlGaAs layers, a second upper cladding layer 29 made of doped AlGaAs and a cap layer 30 made of doped GaAs are successively formed by irradiation with Al, Be, Ga and As molecular beams and with Be, Ga and As molecular beams, respectively. Then the compound semiconductor structure is taken out of the MBE apparatus, and is provided with a P-type electrode 31 and an N-type electrode 32 by vacuum evaporation. Thus, a semiconductor laser as shown in FIG. 3(d) is produced.

As described above, according to the epitaxial growth method of the present invention, a GaAs layer containing impurities is thermally etched at a high temperature (in the range of 600° to 800° C.) by irradiation with a Ga molecular beam and an As molecular beam. Accordingly, in the present examples, a compound semiconductor structure including a flat and clean interface can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for growing a compound semiconductor layer of $Al_xGa_{1-x}As$ ($0 \leq x \leq 1$) on a compound semiconductor substrate by the use of a molecular beam epitaxial apparatus, comprising the steps of:

providing the substrate having a GaAS layer on an upper surface thereof;

thermally etching the GaAs layer by heating the substrate at a temperature and by irradiating the GaAs layer with a gallium molecular beam and an arsenic molecular beam so as to expose the upper surface of the substrate; and growing the $Al_xGa_{1-x}As$ ($0 \leq x \leq 1$) layer on the upper surface of the substrate.

2. A method for growing a compound semiconductor layer according to claim 1, wherein the temperature is in the range of 720° to 760° C.

3. A method for growing a compound semiconductor layer of $Al_xGa_{1-x}As$ ($0 \leq x \leq 1$) on a compound semiconductor substrate by the use of a molecular beam epitaxial apparatus, comprising the steps of:

providing the substrate having a GaAs layer on an upper surface thereof;

thermally cleaning an upper surface of the GaAs layer by heating the substrate at a first temperature and by irradiating the GaAs layer with an arsenic molecular beam;

thermally etching the GaAs layer by heating the substrate at a second temperature which is higher than the first temperature and by irradiating the GaAs layer with a gallium molecular beam and an arsenic molecular beam so as to expose the upper surface of the substrate; and growing the $Al_xGa_{1-x}As$ ($0 \leq x \leq 1$) layer on the upper surface of the substrate.

4. A method for growing a compound semiconductor layer according to claim 3, wherein the first temperature is in the range of 620° to 650° C. and the second temperature is in the range of 720° to 760° C.

5. A method for growing a compound semiconductor layer according to claim 3, wherein the compound semiconductor substrate is a semi-insulated GaAs substrate and the $Al_xGa_{1-x}As$ ($0 \leq x \leq 1$) layer is a GaAs layer including a channel region for a high electron mobility transistor.

6. A method for producing by the use of a molecular beam epitaxial apparatus a semiconductor laser having a substrate, a first layered structure including a double-hetero structure and a GaAs layer, and a second layered structure, the method comprising the steps of:

growing the first layered structure on the substrate so as to deposit the GaAs layer directly on the double-hetero structure;

etching the first layered structure into a striped shape so as to expose a surface of the GaAs layer;

thermally cleaning the exposed surface of the GaAs layer by heating the substrate at a first temperature and by irradiating the GaAs layer with an arsenic molecular beam;

thermally etching the exposed surface of the GaAs layer by heating the substrate at a second temperature which is higher than the first temperature and by irradiating the GaAs layer with a gallium molecular beam and an arsenic molecular beam so as to expose a surface of the double-hetero structure; and growing the second layered structure on the upper surface of the first layered structure including the exposed surface of the double-hetero structure.

7. A method for producing a semiconductor laser according to claim 3, wherein the first temperature is in the range of 620° to 650° C. and the second temperature is in the range of 720° to 760° C.

* * * * *